(12) United States Patent
Mishima et al.

(10) Patent No.: US 7,961,448 B2
(45) Date of Patent: Jun. 14, 2011

(54) DRIVE CONTROL METHOD AND UNIT FOR MICRO MACHINE DEVICE

(75) Inventors: Naoyuki Mishima, Yokohama (JP); Yu Yonezawa, Yokohama (JP); Takeaki Shimanouchi, Kawasaki (JP); Xiaoyu Mi, Kawasaki (JP); Takeshi Takano, Kawasaki (JP); Nobuhisa Aoki, Kawasaki (JP); Yuuta Nakaya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 644 days.

(21) Appl. No.: 12/010,243

(22) Filed: Jan. 23, 2008

(65) Prior Publication Data

US 2008/0180872 A1 Jul. 31, 2008

(30) Foreign Application Priority Data

Jan. 24, 2007 (JP) ................................ 2007-013281

(51) Int. Cl.
*H01H 9/00* (2006.01)
(52) U.S. Cl. ........................................ 361/139; 361/160
(58) Field of Classification Search .................. 361/139, 361/160
See application file for complete search history.

(56) References Cited

U.S. PATENT DOCUMENTS

| | | | |
|---|---|---|---|
| 5,155,573 A | 10/1992 | Abe et al. ......................... 357/51 |
| 6,391,675 B1 | 5/2002 | Ehmke et al. | |
| 6,509,745 B1 | 1/2003 | Marszalek | |
| 6,670,864 B2 | 12/2003 | Hyvonen et al. | |
| 6,806,988 B2 * | 10/2004 | Onuki et al. .................... 359/253 |
| 7,027,282 B2 | 4/2006 | Ryhanen et al. | |
| 7,142,072 B2 | 11/2006 | Katta | |
| 7,227,431 B2 | 6/2007 | Katta | |
| 7,283,018 B2 | 10/2007 | Katta | |
| 2001/0054937 A1 | 12/2001 | Hyvonen et al. | |
| 2002/0047491 A1* | 4/2002 | Hirose et al. ................... 310/309 |
| 2002/0066659 A1 | 6/2002 | Ryhanen et al. | |
| 2004/0040828 A1 | 3/2004 | Ivanciw et al. ............... 200/600 |
| 2005/0104680 A1 | 5/2005 | Katta | |
| 2005/0132806 A1 | 6/2005 | Lee et al. .................... 73/514.32 |
| 2006/0125746 A1 | 6/2006 | Sallese et al. .................... 345/85 |
| 2006/0127085 A1* | 6/2006 | Matsuki et al. ............... 396/483 |
| 2007/0018744 A1 | 1/2007 | Katta | |
| 2007/0018750 A1 | 1/2007 | Katta | |

FOREIGN PATENT DOCUMENTS

CA 2 406 186 10/2001

(Continued)

OTHER PUBLICATIONS

Office Action dated Oct. 29, 2009 corresponding to Korean Patent Application No. 10-2008-0018587.

(Continued)

*Primary Examiner* — Danny Nguyen
(74) *Attorney, Agent, or Firm* — Fujitsu Patent Center

(57) ABSTRACT

A drive control method for a micro machine device is provided. The micro machine device is made up of first and second electrodes opposed to each other and a dielectric layer disposed between them. The drive control method includes the steps of applying a control voltage between the first and the second electrodes so that an electrostatic force is exerted on the first and the second electrodes for displacing the first or the second electrode, and switching polarity of the control voltage at a predetermined period or a shorter period.

19 Claims, 16 Drawing Sheets

FOREIGN PATENT DOCUMENTS

| | | |
|---|---|---|
| EP | 0 909 024 A2 | 4/1999 |
| EP | 0909024 | 4/1999 |
| EP | 1 146 532 A2 | 10/2001 |
| EP | 1 168 608 A2 | 1/2002 |
| JP | 3-284817 | 12/1991 |
| JP | 8-107245 | 4/1996 |
| JP | 2002-36197 | 2/2002 |
| JP | 2002-84148 | 3/2002 |
| JP | 2004-140597 | 5/2004 |
| JP | 2005-184270 | 7/2005 |
| KR | 10-2005/0063238 A | 6/2005 |
| WO | WO 00/31819 | 6/2000 |
| WO | WO 01/80266 A1 | 10/2001 |

OTHER PUBLICATIONS

Chinese Office Action dated Mar. 10, 2010 with its English translation.

Jason Yao J et al: "Topical Review; RF MEMS from a device perspective; Topical review" Dec. 1, 2000, Journal of Micromechanics & Microengineering, Institute of Physics Publishing, Bristol, GB, pp. R9-R38, XP020068606 ISSN: 0960-1317.

Red J R et al: "Measurements of charging in capacitive microelectromechanical switches" Electronics Letters, IEE Stevenage, GB, vol. 38, No. 24, Nov. 21, 2002, pp. 1544-1545, XP006019362 ISSN: 0013-5194.

European Search Report dated Feb. 10, 2009.

European Official Communication dated Feb. 10, 2009 for corresponding European patent application No. 08100445.9.

Office Action dated Mar. 30, 2010 corresponding to Japanese Patent Application No. 2007-094063.

"Chinese Official Communication", mailed by Chinese Patent Office and corresponding to Chinese application No. 200810008706.7 on Jul. 27, 2010, with English translation.

"US Official Communication", (KITOV) Non-Final Rejection, Jul. 16, 2010, in corresponding U.S. Appl. No. 12/071,945 [pending].

Rebeiz, Gabriel M. "RF MEMS Theory, Design and Technology", 2003, pp. 383-429 (previously submitted to Examiner Dec. 19, 2008).

Sallese, Jean-Michel "Switch and RF ferroelectric MEMS: a new concept", 2003, Elsevier, Sensors and Actuators, 109 (2004), pp. 186-194.

* cited by examiner

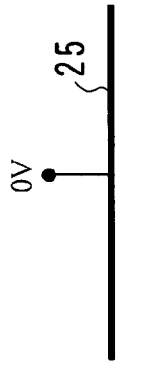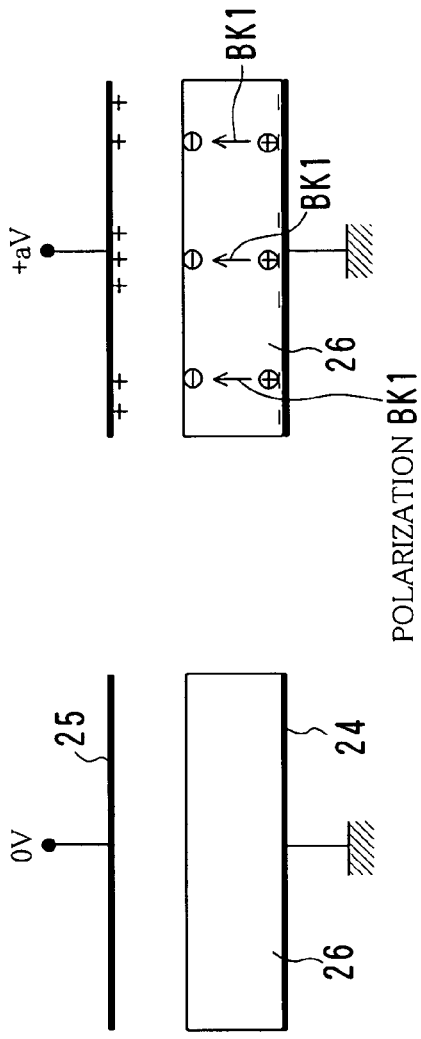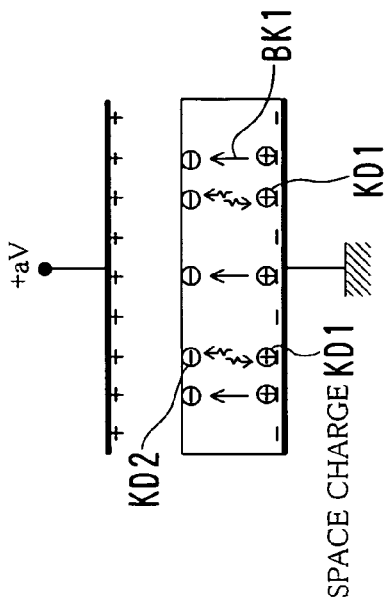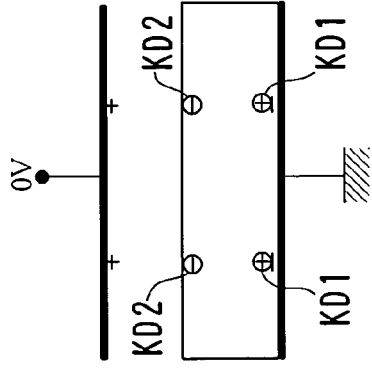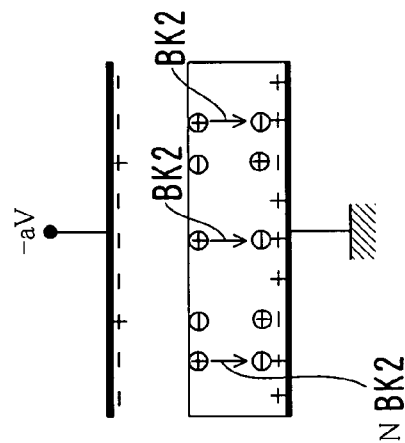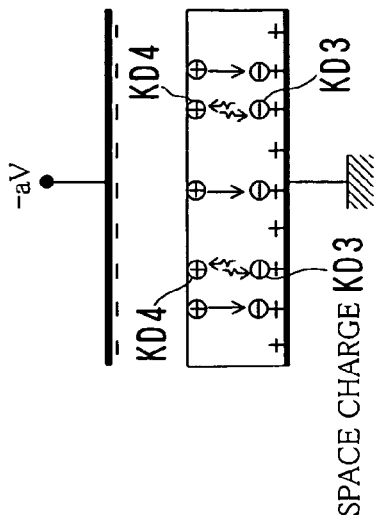

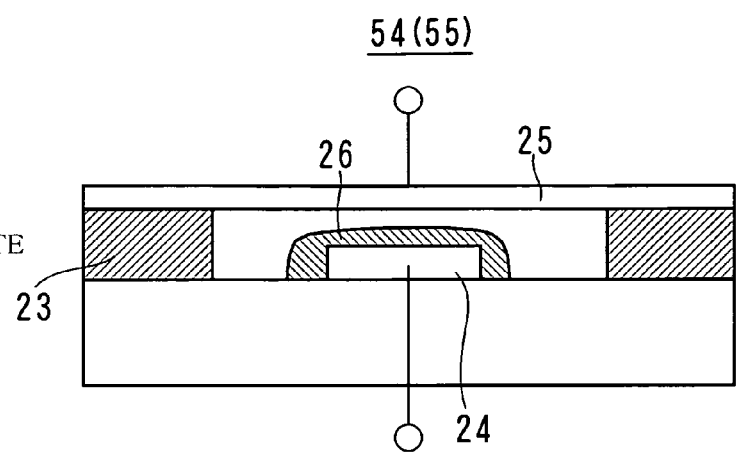
FIG. 15A  OFF STATE
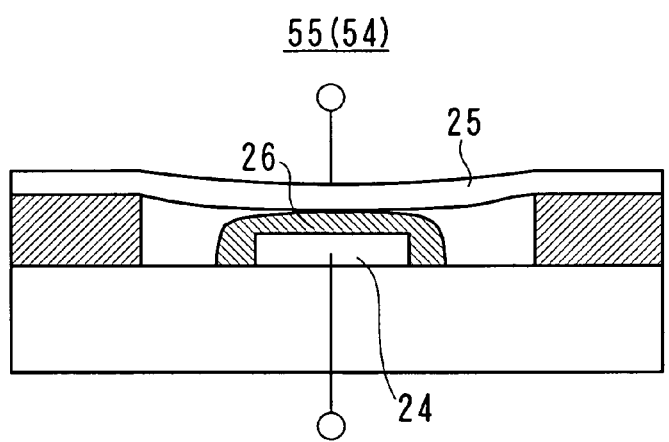
FIG. 15B  ON STATE

DRIVE CONTROL METHOD AND UNIT FOR MICRO MACHINE DEVICE

BACKGROUND OF THE INVENTION

1. Field of the Invention

The present invention relates to a method and a unit for driving and controlling a micro machine device made up of first and second electrodes opposed to each other and a dielectric layer disposed between them, as well as a variable capacitance element and a variable capacitance switch using the method and the unit.

2. Description of the Prior Art

Recently, applications of a micro structure that is obtained by a process using a micro machine processing technique [also referred to as MEMS (Micro Electro Mechanical Systems) or MST (Micro System Technology)] to a radio communication circuit of a micro machine device have received attention (see U.S. Pat. No. 6,391,675, Japanese unexamined patent publications No. 2002-84148 and No. 2002-36197).

The micro machine device can have functions of changing capacitance or electric switch by controlling a mechanical parameter. Therefore, electric characteristics such as a loss are hardly affected by the material, so it can obtain electrically good performances more easily than a switch or a variable capacitance device using a semiconductor. Note that the micro machine device may also be called a "micro machining device", a "micro machine element", a "MEMS electromechanical component" or the like.

Here, a conventional structure of the variable capacitance device (variable capacitance element) realized with the micro machine device will be described with reference to FIG. 1.

In FIG. 1, the variable capacitance device is made up of a substrate 21, a lower electrode 24, a dielectric film 26 covering the lower electrode 24, a supporting film 22 and an upper electrode 25 supported by the supporting film 22, which are formed on the substrate 21. There is a space KG between the dielectric film 26 and the upper electrode 25. Capacitance CP between the lower electrode 24 and the upper electrode 25 is changed by a displacement of the upper electrode 25.

More specifically, when a voltage is applied between the lower electrode 24 and the upper electrode 25, the upper electrode 25 is attracted to the lower electrode 24 by electrostatic attraction between the electrodes so that the space KG is decreased and a value of the capacitance CP increases. The voltage that is applied between the lower electrode 24 and the upper electrode 25 is referred to as a "control voltage" or a "control voltage VC". If the control voltage VC is sufficiently large, the upper electrode 25 is displaced until it contacts the dielectric film 26 directly so that the space KG disappears. Thus, the capacitance CP increases extremely. According to the description in U.S. Pat. No. 6,391,675, such a variable capacitance device is used as a so-called variable capacitance switch (capacitance switch).

However, the conventional variable capacitance device can be hardly controlled substantially because variation of the capacitance CP with respect to the control voltage VC exhibits hysteresis so that reproducibility is too bad to obtain desired capacitance CP precisely.

FIG. 4A shows variation of the capacitance CP when the control voltage VC is changed slowly. More specifically, the control voltage VC is increased slowly from 0 volt to 10 volts and then decreased to 0 volt, and it is further decreased to −10 volts and then increased to 0 volt. During this period hysteresis occurs, so the values of the capacitance CP at the same control voltage VC but on ascending timing and on descending timing are completely different. In addition, the capacitance CP at 0 volt of the control voltage VC is shifted to the larger side so that it has an offset value with respect to a natural value of the capacitance CP at 0 volt and cannot be reset. As a result, the capacitance CP at 0 volt of the control voltage VC is larger than the capacitance CP at 4 volts, for example.

SUMMARY OF THE INVENTION

An object of the present invention is to suppress occurrence of hysteresis in the control of the micro machine device made up of first and second electrodes opposed to each other and a dielectric layer disposed between them, so as to realize easier and more accurate control than the conventional method.

A method according to an aspect of the present invention is a drive control method for a micro machine device made up of first and second electrodes opposed to each other and a dielectric layer disposed between them. The drive control method includes the steps of applying a control voltage between the first and the second electrodes so that an electrostatic force is exerted on the first and the second electrodes for displacing the first or the second electrode, and switching polarity of the control voltage at a predetermined period or a shorter period.

Since polarity of the control voltage is switched at a predetermined period or at a shorter period, for example switched at a period of time shorter than a certain specific period of time, it is possible to prevent charge up of the dielectric layer so that generation of hysteresis in capacitance can be suppressed. Note that if the switching is performed repeatedly, the periods (of time) may be different from each other.

The period for switching the polarity of the control voltage is a short period of time in which polarization due to space charge transfer does not occur in the dielectric layer. For example, it is 100 milliseconds or shorter.

In addition, an impedance matching circuit according to another aspect of the present invention includes a variable capacitance element that is a micro machine device of variable capacitance having first and second electrodes opposed to each other and a dielectric layer disposed between them. A control voltage is applied between the first and the second electrodes so that an electrostatic force is exerted on the first and the second electrodes for displacing the first or the second electrode and thus matching impedance, and polarity of the control voltage is switched during an idle period of the communication circuit.

Since polarity of the control voltage is switched during idle time of the communication circuit, generation of space charge in the variable capacitance (variable capacitance element) can be suppressed. Thus, influence of fluctuation of the capacitance when the control voltage is switched is eliminated, so that the function of the impedance matching circuit is not affected badly.

A transmission and reception switching circuit according to yet another aspect of the present invention includes a first variable capacitance switch made up of a micro machine device that enables a transmission circuit to perform transmission operation when it is turned on, and a second variable capacitance switch made up of a micro machine device that enables a reception circuit to perform reception operation when it is turned on. Each of the first and the second variable capacitance switches includes first and second electrodes opposed to each other and a dielectric layer disposed between them. The first or the second electrodes are displaced so as to switch on and off of a circuit when a control voltage is applied between the first and the second electrodes. Polarity of the control voltage to be applied is switched at the timing of switching each of the first and the second variable capacitance switches from off to on.

In this way, using the variable capacitance switch made up of a micro machine device, switching operation of transmission and reception can be performed securely with a simple structure.

According to the present invention, it is possible to suppress generation of hysteresis in the voltage control characteristic of the micro machine device including first and second electrodes opposed to each other and a dielectric layer disposed between them. Thus, it is possible to perform more accurate control more easily than the conventional method.

BRIEF DESCRIPTION OF THE DRAWINGS

FIGS. 6A-6F are diagrams for explaining charge up of the variable capacitance device.

FIGS. 15A and 15B are diagrams showing an operational state of a variable capacitance switch.

DESCRIPTION OF THE PREFERRED EMBODIMENTS

The invention will now be described in detail with reference to the attached drawings.

[Micro Machine System]

Figure 1:
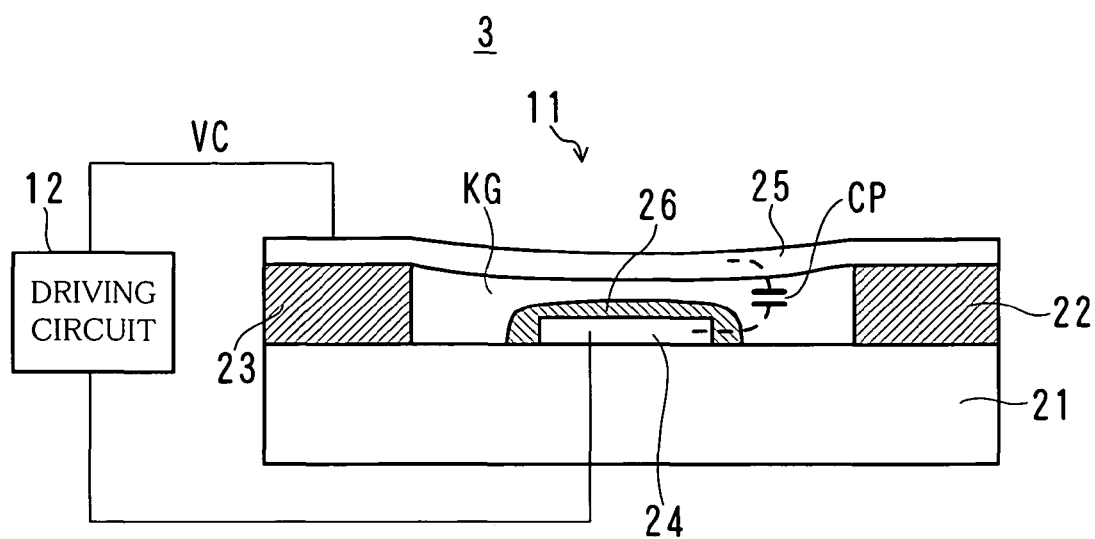
FIG. 1 is a diagram showing an example of a micro machine system according to an embodiment of the present invention.

In FIG. 1, a micro machine system 3 is made up of a variable capacitance device 11 that is a micro machine device and a driving circuit 12.

The variable capacitance device (variable capacitance element) 11 includes a substrate 21 made of silicone, glass or the like, a lower electrode 24 formed on the substrate 21, and a dielectric film 26 covering the lower electrode 24. In addition, supporting films 22 and 23, and an upper electrode 25 supported by the supporting films 22 and 23 are also formed on the substrate 21. A space KG is provided between the dielectric film 26 and the upper electrode 25. There is capacitance CP between the lower electrode 24 and the upper electrode 25, and the capacitance CP is altered by displacement of the upper electrode 25.

More specifically, the driving circuit 12 applies a control voltage VC between the lower electrode 24 and the upper electrode 25. In accordance with the absolute value of the control voltage VC, electrostatic force (electrostatic attraction) is exerted between the lower electrode 24 and the upper electrode 25. As a result, the upper electrode 25 is attracted and displaced downward. Thus, the space KG is decreased so that a value of the capacitance CP increases.

Figure 2:
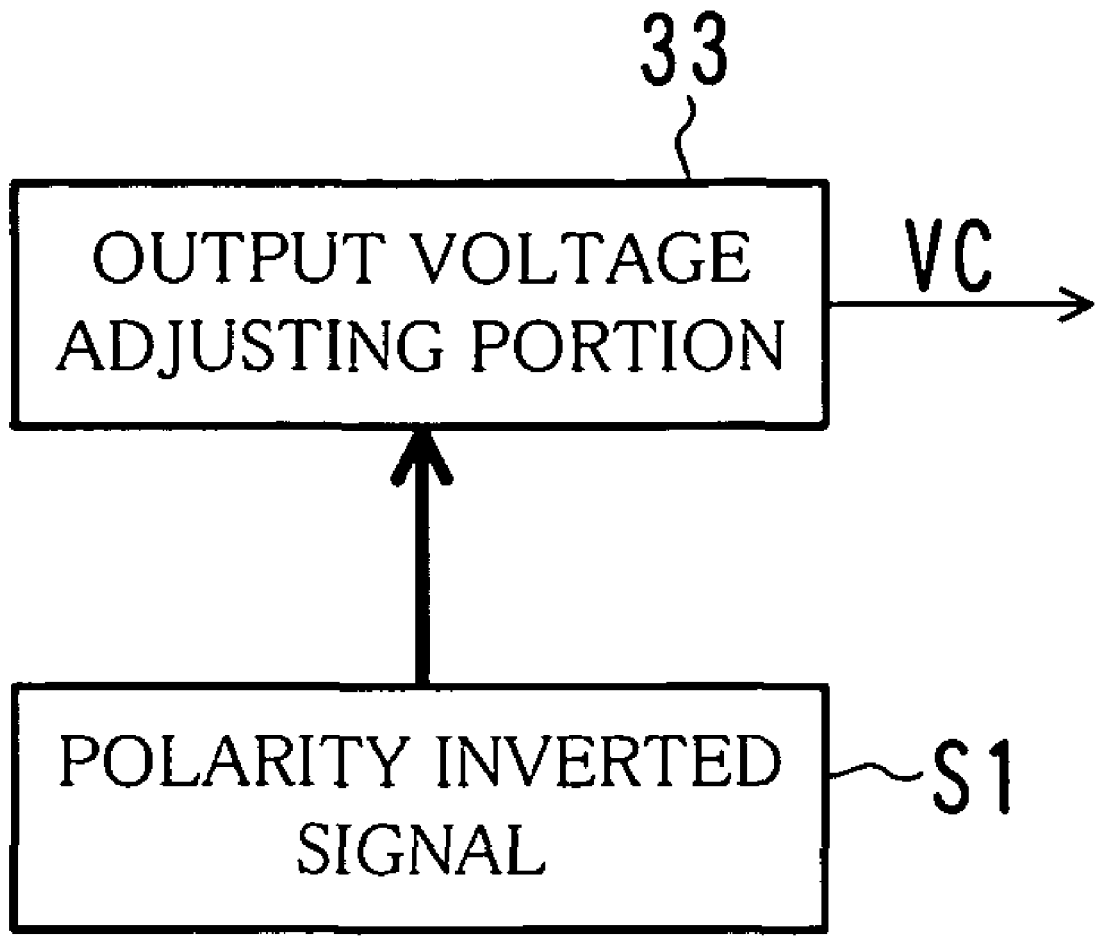
FIG. 2 is a block diagram showing a structure example of a driving circuit.

In FIG. 2, the driving circuit 12 is made up of an output voltage adjusting portion 33 and a polarity inverted signal S1 that is supplied externally. Note that the driving circuit 12 can be realized by hardware using an analog or digital circuit element, or software using a CPU, a DSP or the like executing an appropriate program, or a combination of the both.

The output voltage adjusting portion 33 adjusts the control voltage VC that is applied to the variable capacitance device 11 to be a predetermined value. A value of the control voltage VC is determined in accordance with a purpose and contents of the control. In addition, a polarity of the control voltage VC changes in accordance with the polarity inverted signal S1 supplied externally.

The polarity change of the control voltage VC is preferably performed at a period of 200 milliseconds or shorter, i.e., at a frequency of 5 Hz or higher, though it depends on a structure, a size, a material and the like of the variable capacitance device 11. It is more preferable to perform the polarity change of the control voltage VC at 10 Hz or higher (100 milliseconds or shorter). In addition, the period of the polarity change may be approximately 50-200 Hz, for example.

Figure 3A:
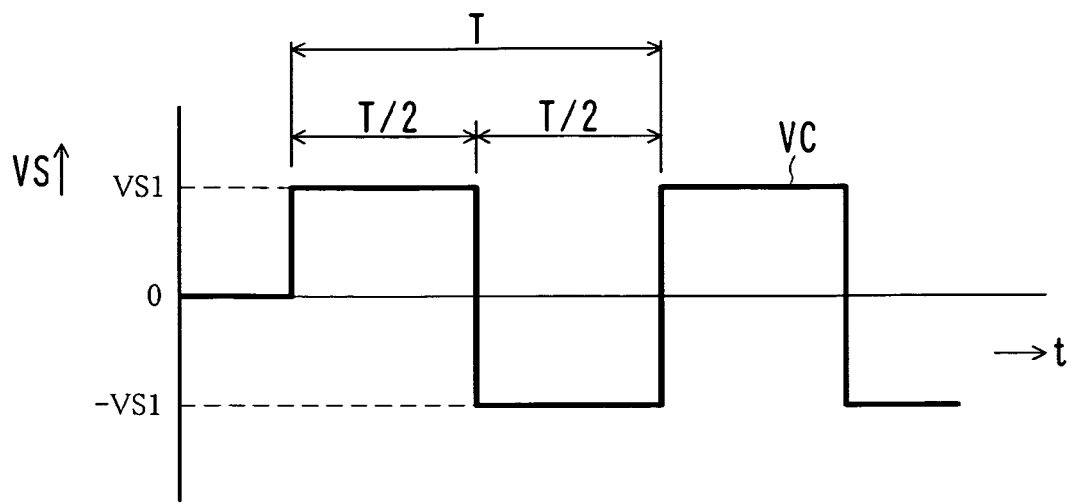
FIGS. 3A and 3B are diagrams showing examples of a voltage waveform of a control voltage.
Figure 3B:
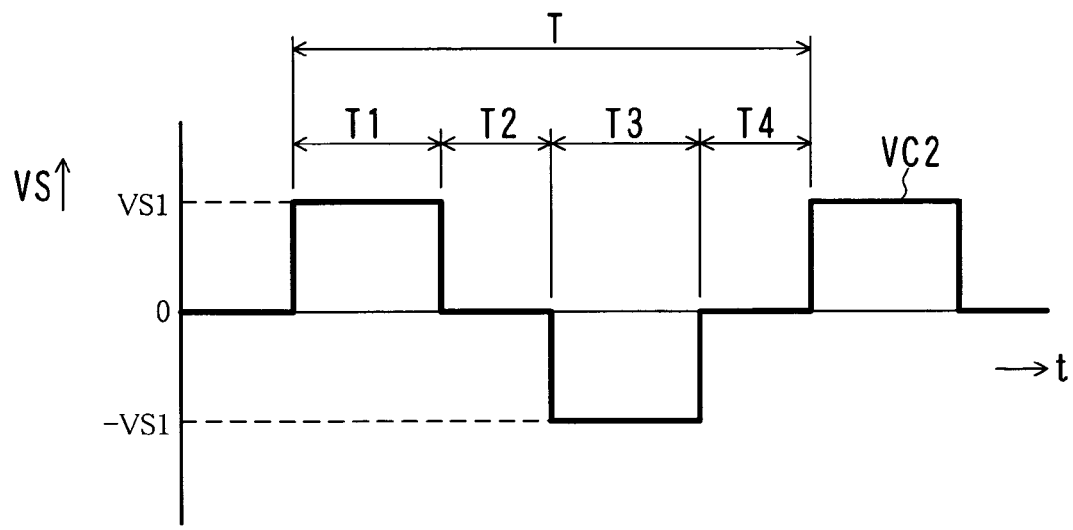

In any case, the control voltage VC is a voltage having a rectangular wave alternating its polarity substantially at regular intervals as shown in FIG. 3A. A value of the voltage VS that is amplitude can be set to any value within a range from 0 to a maximum value. In addition, it is possible to adopt a waveform of a control voltage VC2 as shown in FIG. 3B, in which the voltage is 0 during periods T2 and T4 when the polarity changes.

Since the polarity of the control voltage VC changes substantially at regular intervals, polarization due to space charge transfer is not generated inside the dielectric film 26. Even if it is generated, its quantity is very small so that hysteresis does not occur in the control of the capacitance CP by the control voltage VC, or the hysteresis is reduced substantially.

The reason will be described below with reference to FIGS. 6A-6F.

In FIGS. 6A-6F, the lower electrode 24 is connected to the ground, and the control voltage VC is applied between the lower electrode 24 and the upper electrode 25. In other words, one of the electrodes for the control voltage VC is connected to the ground in this case. As shown in FIG. 6A, if the control voltage VC is 0 volt, there is no charge inside the lower electrode 24, the upper electrode 25 and the dielectric film 26.

FIG. 6B shows the state where the voltage VS of the control voltage VC becomes +a volts, i.e., the state where a positive voltage of +a volts is applied to the upper electrode 25. In this state, negative charge is generated at the interface between the lower electrode 24 and the dielectric film 26 while positive charge is generated at the surface of the upper electrode 25. At the same time, polarization BK1 is generated inside the dielectric film 26 so as to cancel the charge at the interface with the electrode. This polarization BK1 is generated following the change of potentials of the upper and the lower electrodes 24 and 25. Inside the dielectric film 26, space charge is generated that is accompanied by ion migration besides the polarization BK1 and requires time for the ion migration.

FIG. 6C shows a state of the charge approximately one second after the state shown in FIG. 6B. Inside the dielectric film 26, positive space charge KD1 similarly to the charge of the polarization BK1 and negative space charge KD2 are generated. Charge is supplied to the upper and the lower electrodes 24 and 25 so as to cancel the space charges KD1 and KD2.

Figure 4A:
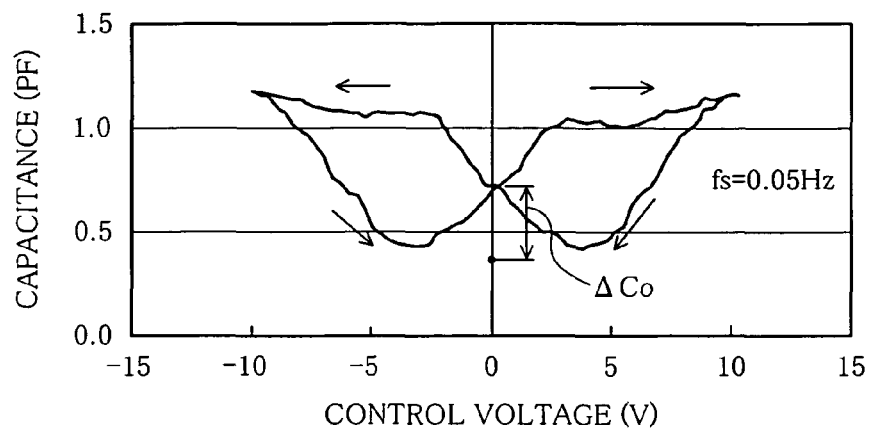
FIGS. 4A and 4B are diagrams showing relationships between a control voltage and capacitance of a variable capacitance device.

FIG. 6D shows the state where the control voltage VC drops to 0 volt again, and the potential of the upper electrode 25 becomes 0 volt. In this state, the space charges KD1 and KD2 that requires time for migration are left. Since the space charges KD1 and KD2 are left in this way, the capacitance CP cannot go back to the original state even if the control voltage VC becomes 0 as shown in FIG. 4A. Thus, it has an offset value (offset capacitance) $\Delta C0$ with respect to the initial value of the capacitance CP.

FIG. 6E shows the state where the control voltage VC further drops from the state shown in FIG. 6D, and the potential of the upper electrode 25 becomes −a volts. The upper and the lower electrodes 24 and 25 generate negative charge and positive charge, respectively. Accompanying this, polarization BK2 is generated inside the dielectric film 26. At this time point, the space charges KD1 and KD2 are still left partially. The space charges KD1 and KD2 are being canceled as time passes, and finally space charges KD3 and KD4 due to charges having the opposite polarities are generated as shown in FIG. 6F. In this way, migration of the space charge KD is repeated so that the hysteresis appears as shown in FIG. 4A.

Note that the space charge KD remaining inside the dielectric film 26 increases as time period of applying voltages to the upper and the lower electrodes 24 and 25 is longer and as the voltage to be applied is higher. Although other explanation for the mechanism of generating the space charge KD can be tried, it will be the same in that polarization having high migration speed and polarization having low migration speed such as the space charge KD coexists inside the dielectric film 26.

In this way, if the capacitance CP exhibits hysteresis with respect to the control voltage VC in the variable capacitance device 11, reproducibility of the capacitance CP is deteriorated so that the control thereof becomes difficult.

Therefore, in the present embodiment, in order to suppress the generation of the space charge KD, polarities of the voltages to be applied to the upper and the lower electrodes 24 and 25 are exchanged at a time period shorter than the migration time of the space charge KD.

Figure 4B:
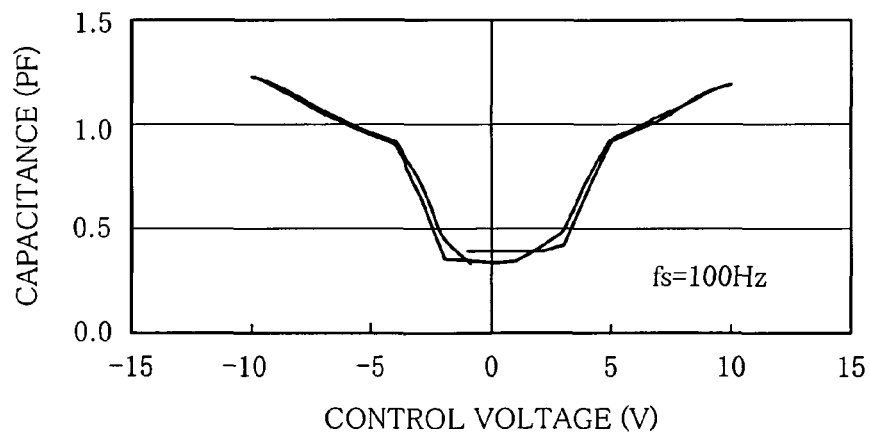

FIG. 4B shows a variation of the capacitance CP when the amplitude of the control voltage VC is changed and the speed of the change is increased in the same manner as described above with reference to FIG. 4A. More specifically, it shows the case where the voltage having the waveform as shown in FIG. 3A is applied as the control voltage VC, and the period T thereof is set to 10 milliseconds (i.e., the frequency fs=100 Hz). In this case, polarities of the voltages to be applied to the upper and the lower electrodes 24 and 25 are exchanged every 5 milliseconds.

If the polarities are exchanged at that high speed, the variable capacitance device 11 can be controlled without migration of the space charge KD so that little hysteresis of the capacitance CP is generated.

As described above, charge up of the dielectric film 26 can be prevented by using the control voltage VC as shown in FIGS. 3A and 3B, and its effect can be obtained more easily as the period T/2 of exchanging polarity of the control voltage VC is shorter. The exchange period of the control voltage VC varies in accordance with a material of the dielectric film 26 that is used for the variable capacitance device 11. If $Al_2O_3$ or $SiO_2$ is used for the dielectric film 26, the exchange period T/2 can be set to a value of 100 milliseconds or shorter so as to prevent the charge up of the dielectric film 26.

Figure 5:
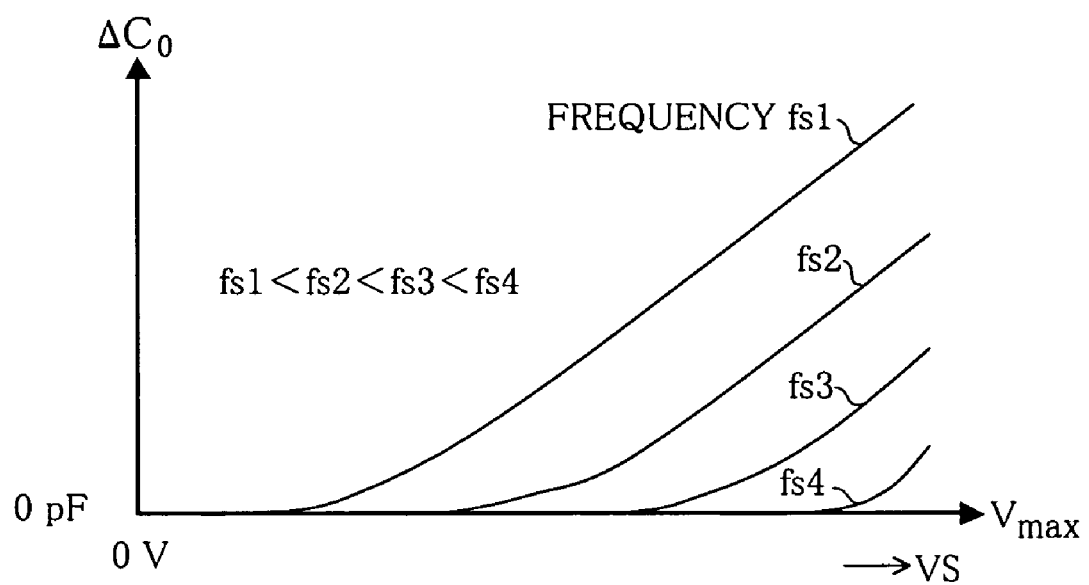
FIG. 5 is a diagram showing relationships between a control voltage and an offset value with parameters of frequency.

FIG. 5 shows relationships between the voltage VS of the control voltage VC and the offset value $\Delta C0$ of the capacitance CP with parameters of frequency fs of exchanging the polarity of the control voltage VC. More specifically, it shows data of the offset value $\Delta C0$ that is a shift from the initial value of the capacitance CP at the voltage VS of 0 volt with respect to the maximum value of the voltage VS of the control voltage VC. Note that the frequency fs has a relationship of fs1<fs2<fs3<fs4. It is possible to determine an appropriate exchange period of polarity of the control voltage VC with respect to the dielectric material that is used for the dielectric film 26 based on FIG. 5. If a ratio of the offset value $\Delta C0$ to the maximum value of the capacitance CP is 10% or smaller, it can be used in an ordinary circuit within a range of an error without a problem.

It is understood from FIG. 5 that the higher the frequency fs is, the smaller the offset value $\Delta C0$ is. For example, since the offset value $\Delta C0$ is sufficiently small if the frequency is fs4, the control voltage VC of the frequency fs4 can be used if the value is 10% or smaller of the maximum value of the capacitance CP.

[Variation of Variable Capacitance Device]

Next, various variations of the variable capacitance device 11 will be described.

Figure 7:
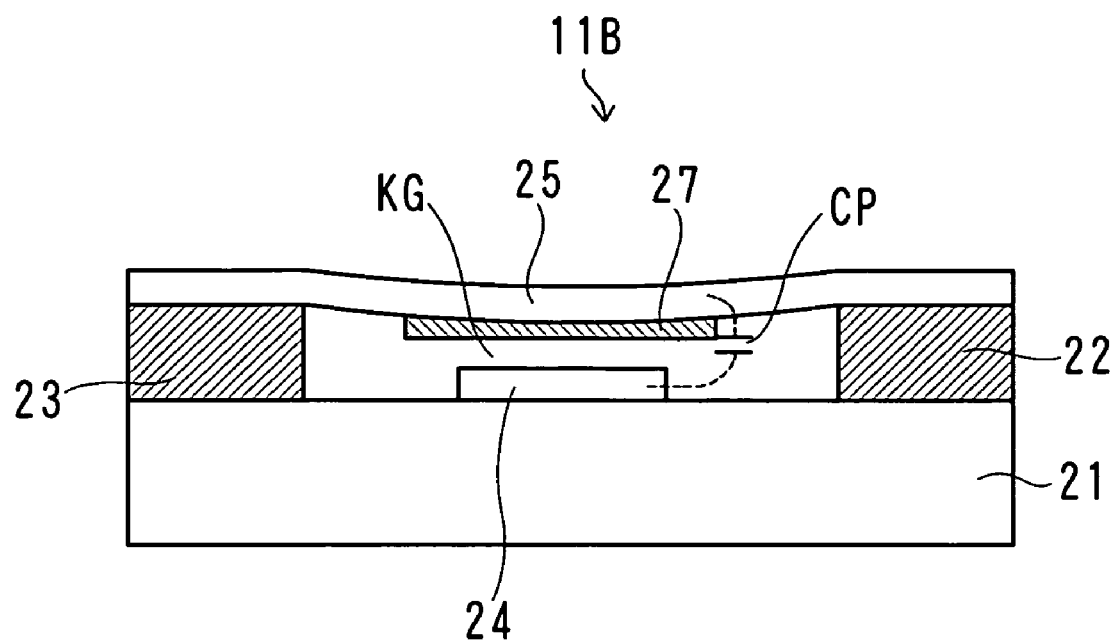
FIG. 7 is a diagram showing the variable capacitance device according to a first variation.
Figure 8:
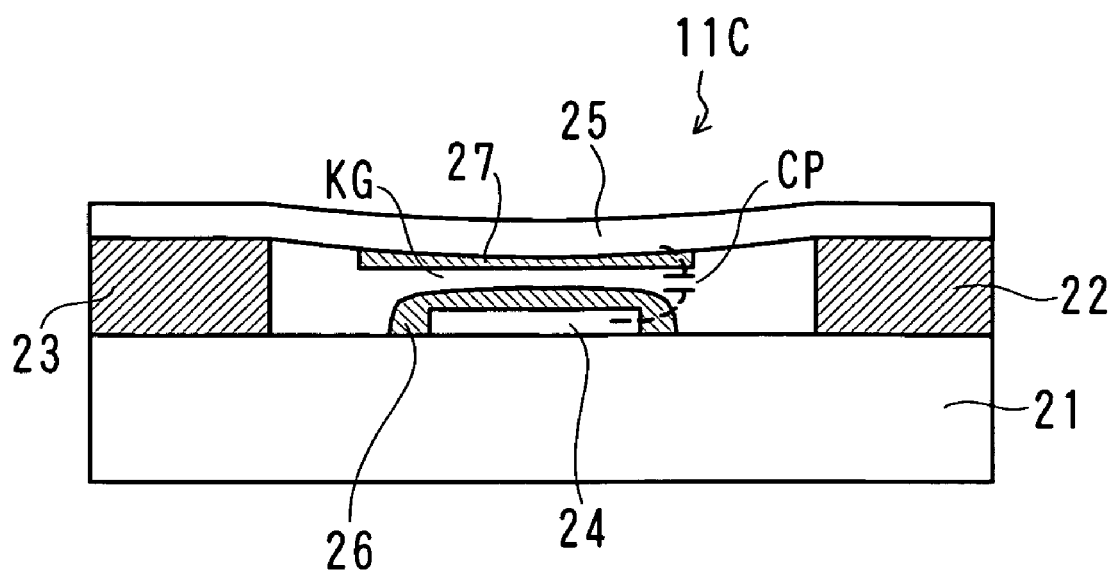
FIG. 8 is a diagram showing the variable capacitance device according to a second variation.
Figure 9:
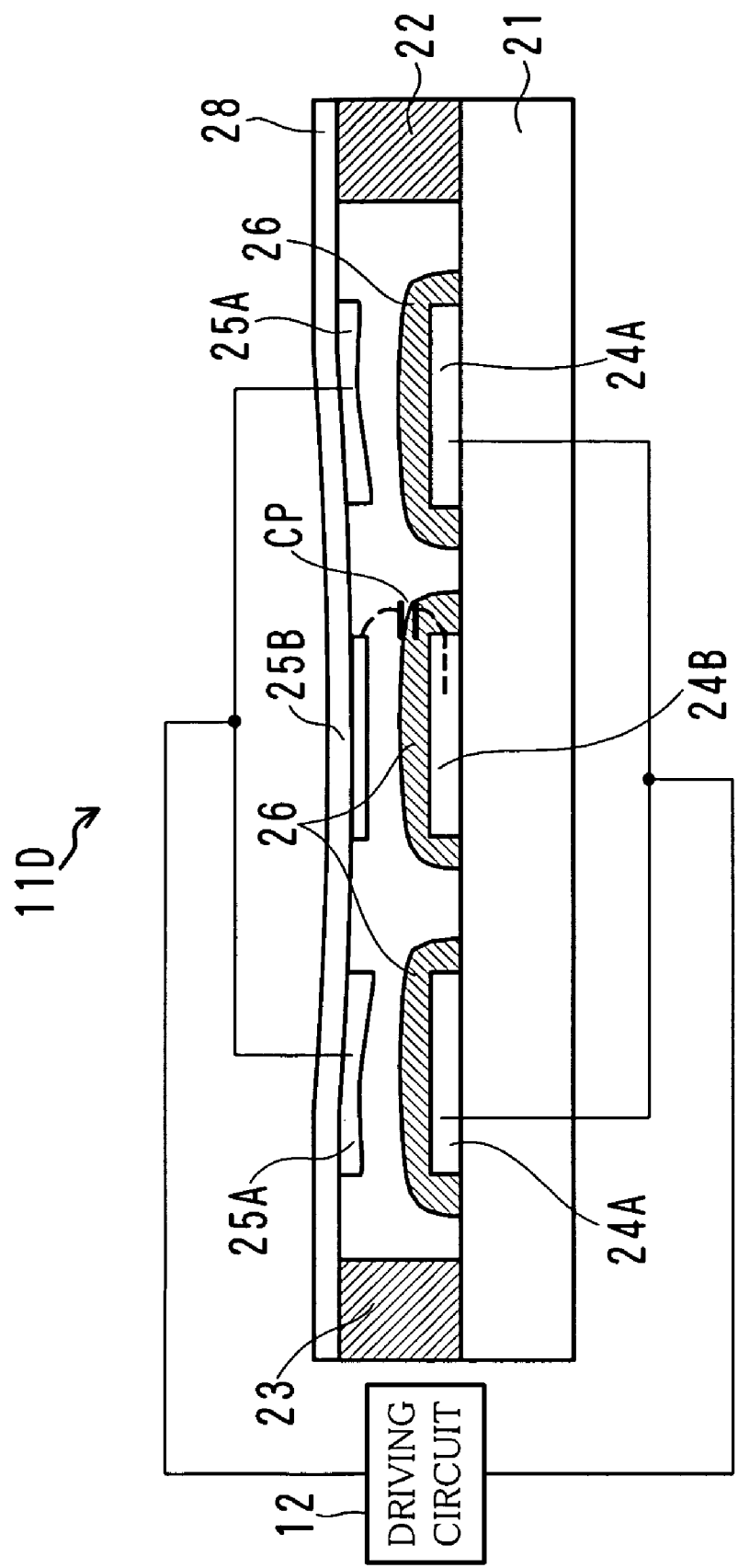
FIG. 9 is a diagram showing the variable capacitance device according to a third variation.

FIG. 7 is a diagram showing a variable capacitance device 11B according to a first variation, FIG. 8 is a diagram showing a variable capacitance device 11C according to a second variation, and FIG. 9 is a diagram showing a variable capacitance device 11D according to a third variation.

In the variable capacitance device 11 shown in FIG. 1, the lower electrode 24 is formed on the substrate 21 so as to be fixed directly to the same. However, it is possible to adopt another structure in which the lower electrode 24 is also fixed to the substrate 21 via a gap though drawing thereof is omitted.

In addition, although the dielectric film 26 covers the lower electrode 24 in the variable capacitance device 11 shown in FIG. 1, it is possible to adopt another structure in which a dielectric film 27 covers the upper electrode 25 like the variable capacitance device 11B of the first variation shown in FIG. 7.

In addition, it is possible to adopt another structure like the variable capacitance device 11C of the second variation shown in FIG. 8, in which the dielectric film 26 covers the lower electrode 24, and the dielectric film 27 covers the upper electrode 25.

In addition, although the drawing is omitted, it is possible to provide a metal film partially on the surface of one of the dielectric films 26 and 27 with respect to the variable capacitance devices 11, 11B, 11C and the like described above. If the metal film is provided, charge remaining in the dielectric film 26 or 27 can be discharged easily.

In addition, although the electrode to which the voltage VS is applied for displacing the upper electrode 25 and the electrode for generating the capacitance CP are the same electrode in the variable capacitance devices 11, 11B and 11C shown in FIGS. 1, 7 and 8, it is possible to provide these functions independently of each other.

More specifically, two separate lower electrodes 24A and 24A are formed on both sides of a lower electrode 24B on the substrate 21 that generates the capacitance CP in the variable capacitance device 11D shown in FIG. 9, and the upper portions of the lower electrodes 24B and 24A are covered with the dielectric film 26. An insulator film 28 supported by the supporting films 22 and 23 on the substrate 21 is provided above the lower electrodes 24B and 24A, and upper electrodes 25A and 25B are formed on the lower surface of the insulator film 28 at positions corresponding to the lower electrodes 24A and 24B, respectively. A space KG is provided between the dielectric film 26 and the upper electrode 25A or 25B, so that the capacitance CP is formed between the lower electrode 24B and the upper electrode 25B.

When the control voltage VC is applied between the two lower electrodes 24A and the two upper electrodes 25A, the upper electrodes 25A and the insulator film 28 are attracted downward by the electrostatic attraction between them. As a result, the space KG is decreased so that a value of the capacitance CP increases. In this case, if the control voltage VC is direct current, hysteresis occurs in the lower electrodes 24A and the upper electrodes 25A that are the control electrodes. As described above, by using the control voltage VC whose polarity changes at a predetermined period, displacement of the upper electrode 25A and the insulator film 28 can be controlled accurately so that the capacitance CP can be controlled accurately.

[Impedance Matching Circuit]

Next, another example will be described, in which the variable capacitance device 11 is applied to an impedance matching circuit disposed at the end of a radio transmission circuit.

Figure 10:
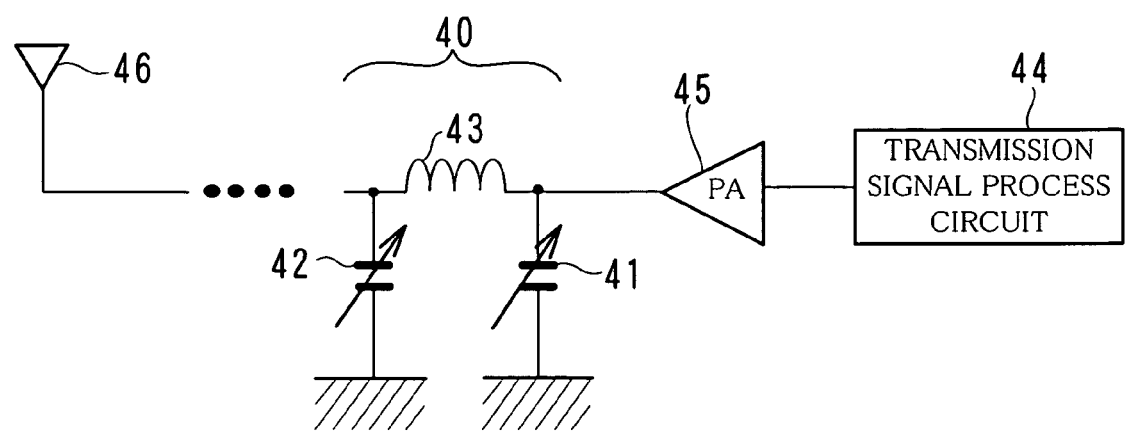
FIG. 10 is a diagram showing an example of an impedance matching circuit of a radio transmission circuit.
Figure 11:
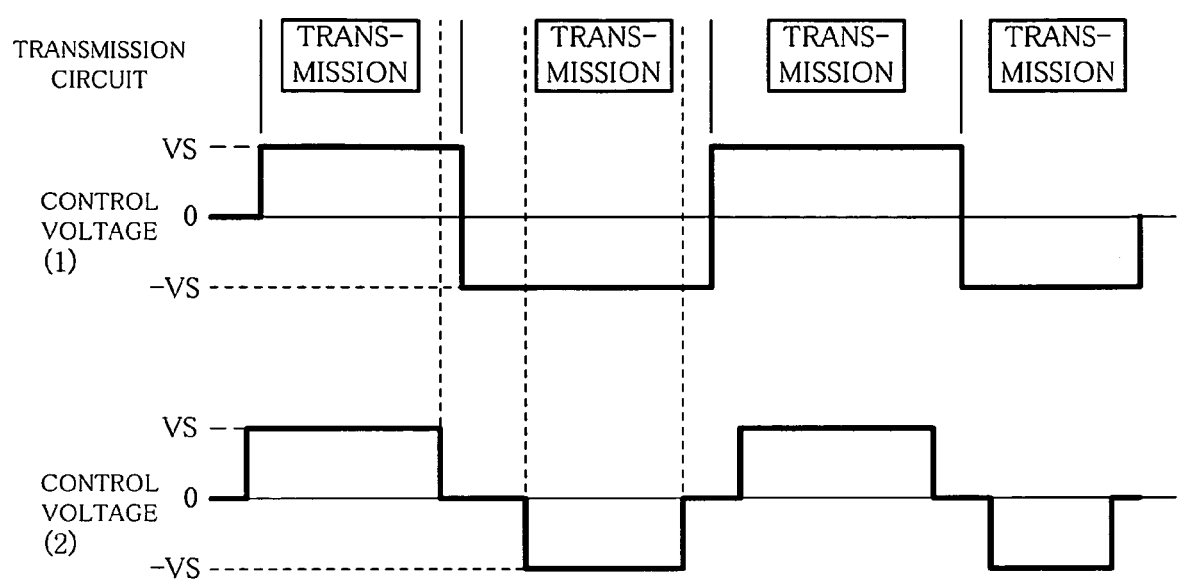
FIG. 11 is a diagram showing timing for switching polarity of the control voltage.

FIG. 10 is a diagram showing an example of an impedance matching circuit 40 of the radio transmission circuit, and FIG. 11 is a diagram showing timing for switching polarity of the control voltage VC.

In FIG. 10, the signal from a transmission signal process circuit 44 is amplified by a high frequency power amplifier 45 at the end of circuit. With respect to the output of the high frequency power amplifier 45, the impedance matching circuit 40 performs impedance matching with an antenna 46. The impedance matching circuit 40 is a π type circuit made up of variable capacitances 41 and 42 and an inductance 43. Usually, power amplifier circuits have impedance values different largely in accordance with a frequency band to be used and an amplification output power, so this impedance matching circuit 40 is necessary.

Here, the variable capacitance device 11, 11B, 11C or 11D is used as each of the variable capacitances 41 and 42, and it is controlled by the control voltage VC described above. The control voltage VC is adjusted so that the capacitance CP of the variable capacitances 41 and 42 is adjusted for realizing impedance matching with the antenna 46.

In this specification, the "variable capacitances 41 and 42" mean "variable capacitance elements (variable capacitors)" as devices realized by the variable capacitance device 11, 11B, 11C or 11D in some cases, and they mean functions realized by the variable capacitance device 11, 11B, 11C or 11D in other cases.

The control voltage VC is a voltage having a waveform shown in FIG. 3A or 3B, and its polarity changes at a predetermined period T/2 for suppressing generation of space charge KD in the variable capacitances 41 and 42. However, if polarity of the control voltage VC changes and the high frequency power amplifier 45 is working, i.e., performing transmission, the voltage VS will be lowered at the moment of switching polarity. As a result, a value of the capacitance CP of the variable capacitances 41 and 42 varies so that the impedance matching may fail.

Therefore, in the present embodiment, polarity of the control voltage VC is changed while the high frequency power amplifier 45 is not working, i.e., not performing transmission. In other words, the polarity is changed when a signal does not flow in the variable capacitances 41 and 42. Thus, influence of fluctuation of the capacitance CP when the control voltage VC is switched is eliminated, so that the function of the impedance matching circuit 40 is not affected badly.

More specifically, as shown in FIG. 11, polarity of the control voltage VC is switched during the time period while the transmission circuit is not performing the transmission. The control voltage (1) is an example of the case where it has only the positive voltage VS and the negative voltage VS, and the polarity is changed during an idle period of the transmission circuit. The control voltage (2) is an example of the case where it has 0 volt period between the positive voltage VS and the negative voltage VS, and the 0 volt period is set as long as possible in the idle period of the transmission circuit. In this case, it has waveform similar to the control voltage VC2 shown in FIG. 3B, and it is possible to prevent the charge up of the dielectric film 26 more effectively by passing through the 0 volt period.

Although not shown in FIG. 10, it is necessary that the control voltage VC for controlling the variable capacitances 41 and 42 is not applied to the high frequency power amplifier 45 and the like. For this purpose, it is possible to adopt various countermeasures such as using capacitor of an appropriate capacitance for cutting low frequency components and an appropriate LC filter for cutting high frequency components.

[Switching of Polarity of Control Voltage in Mobile Terminal]

Next, as for a case where the variable capacitance device 11, 11B, 11C or 11D is incorporated in a mobile terminal, timing of changing polarity of the control voltage VC will be described. An example of the mobile terminal that is a mobile phone of TDD method (transmission and reception time-division duplex method) will be described.

As the TDD method, there are GSM (Global System for Mobile Communications), WiMAX (Worldwide Interoperability for Microwave Access of IEEE 802.16 standard) and the like.

Figure 12:
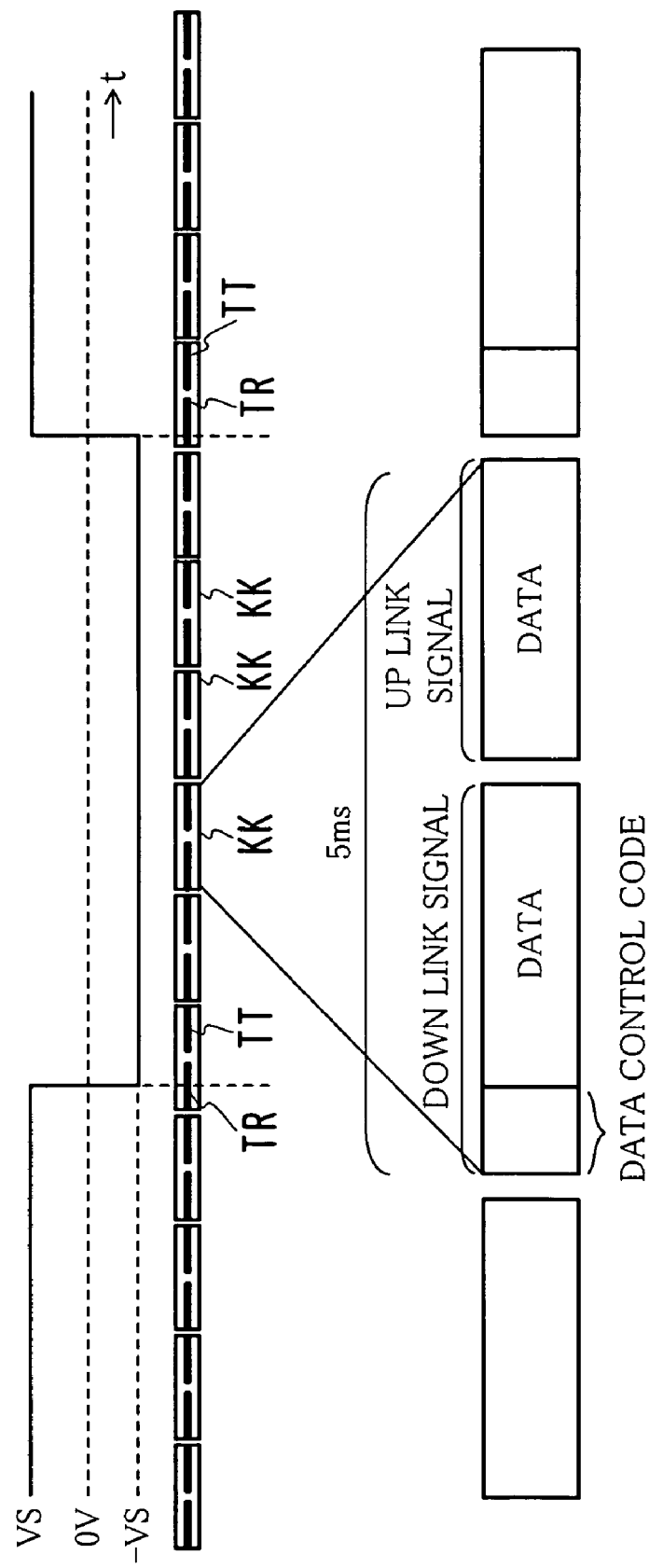
FIG. 12 is a diagram showing a relationship between transmission/reception and timing for switching polarity.

FIG. 12 is a diagram showing a relationship between transmission/reception sequence of WiMAX and timing for switching polarity of the control voltage VC.

As shown in FIG. 12, the transmission and reception is divided by a unit of 5 milliseconds, and one reception and one transmission are performed in turn in each of divided transmission and reception sections KK. More specifically, the mobile terminal receives a reception signal (down link signal) from a base station at the start of each transmission and reception section KK, and then it sends out a transmission signal (up link signal) to the base station.

During the period for receiving the reception signal from the base station, the transmission circuit shown in FIG. 10, for example, is in an idle state, during which polarity of the control voltage VC for controlling the variable capacitances 41 and 42 is switched. The switching of polarity of the control voltage VC may be performed every time when the transmission circuit becomes the idle state or every plurality of times. In the example shown in FIG. 12, one change of polarity is performed in six idle states of the transmission circuit, i.e., every time when six transmission and reception sections KK are performed. Therefore, in this case, polarity is changed at a period of 30 milliseconds.

By performing this control, the hysteresis due to the charge up of the dielectric film 26 is eliminated as described above, so that the variable capacitances 41 and 42 made up of the variable capacitance device can be adjusted accurately. In addition, since the polarity of the control voltage VC is switched during the idle period of the transmission circuit, it is possible to avoid the influence of instant variation of the variable capacitances 41 and 42.

Figure 13:
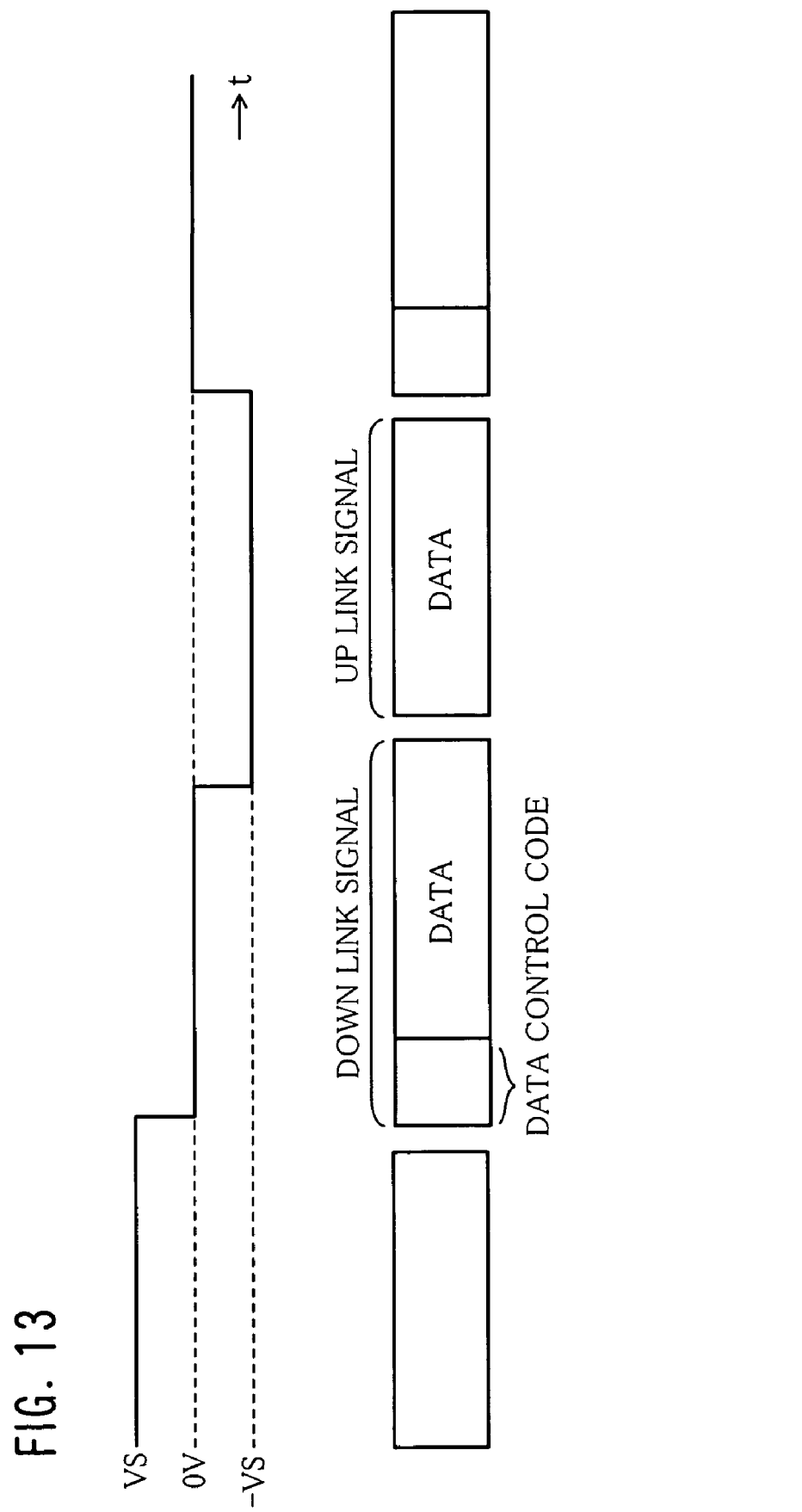
FIG. 13 is a diagram showing another example of a relationship between transmission/reception and timing for switching polarity.

FIG. 13 is a diagram showing another example of a relationship between transmission/reception sequence of WiMAX and timing for switching polarity of the control voltage VC.

In FIG. 12, the polarity of the control voltage VC is switched directly in a reception section of the mobile terminal. In contrast, in FIG. 13, the polarity of the control voltage VC is switched after the period of 0 volt.

More specifically, in the reception section of the mobile terminal, the control voltage VC is set to 0 volt at the initial timing, and the polarity of the control voltage VC is changed and raised at the end timing. Therefore, the control voltage VC becomes positive voltage (+VS) or negative voltage (−VS) only during the period that covers the transmission section of the mobile terminal and substantially equal to the same. In this way, the charge up of the dielectric film 26 can be prevented securely so that the variable capacitance device can be controlled accurately by elongating the time while the voltage VS is not applied.

The time division of the transmission and reception is 5 milliseconds with the radio communication of the WiMAX method, as shown in FIG. 13. Therefor, because the polarity exchange period is 5 milliseconds, the charge up of the dielectric film 26 of the variable capacitance device can be suppressed. There is no problem substantially in the control accuracy of the variable capacitance.

In other words, for example, when the period of switching polarity of the control voltage VC is 5 milliseconds, if the variation of the capacitance CP from the initial value is 10% or smaller, the variable capacitance device can be applied to the transmission and reception circuit of the mobile terminal of WiMAX. In addition, material, thickness and the like of the dielectric layer should be selected for making the variable capacitance device that can be applied as described above.

[Switching of Transmission and Reception of Mobile Terminal by Variable Capacitance Switch]

Next, the case where the variable capacitance device 11, 11B, 11C or 11D is incorporated in the mobile terminal as a variable capacitance switch will be described.

Figure 14:
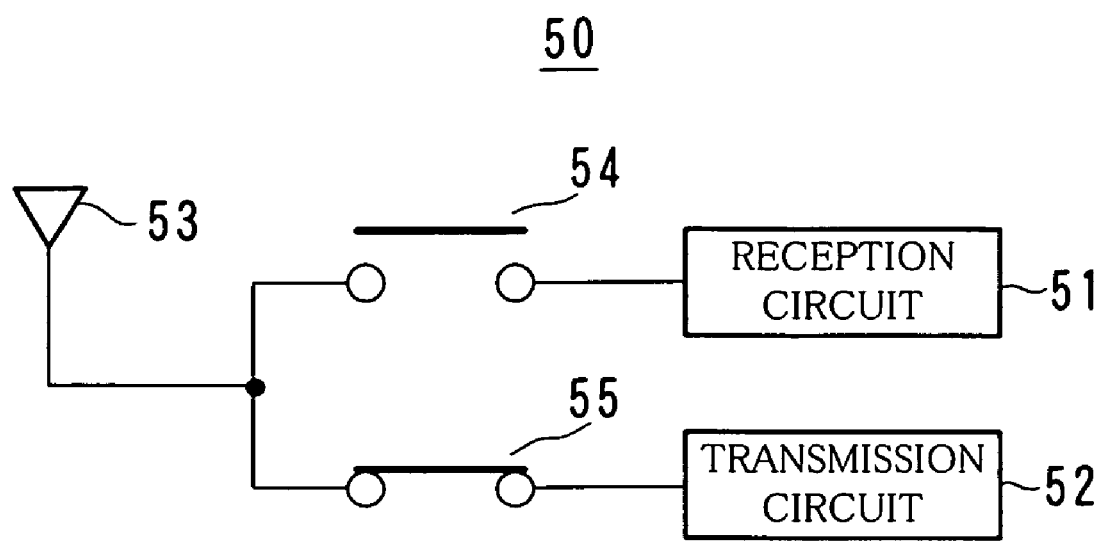
FIG. 14 is a diagram showing a switching circuit for transmission and reception of a mobile terminal.
Figure 16:
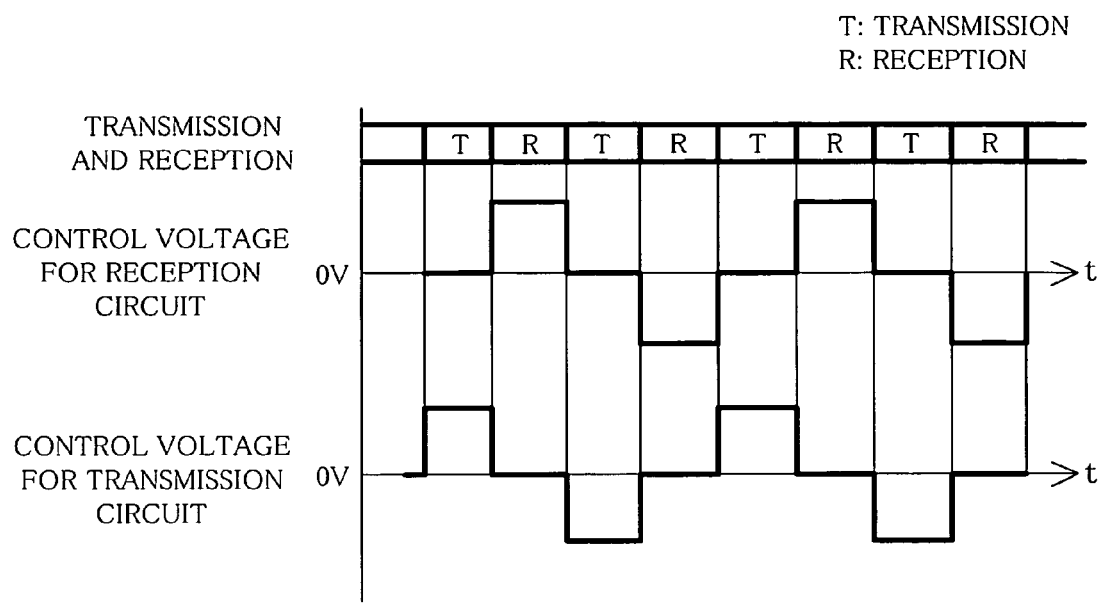
FIG. 16 is a diagram showing a relationship between the transmission/reception and timing for switching polarity.

FIG. 14 is a diagram showing a switching circuit for transmission and reception of the mobile terminal, FIGS. 15A and 15B are diagrams showing an operational state of the variable capacitance switch. And FIG. 16 is a diagram showing a relationship between the switching timing of the transmission/reception and timing for switching polarity of the control voltage VC.

In FIG. 14, variable capacitance switches 54 and 55 are provided for connecting an antenna 53 selectively to a reception circuit 51 or a transmission circuit 52 in a switching circuit 50 of transmission and reception. In other words, the variable capacitance switch 54 is a switch for connecting or disconnecting the antenna 53 and the reception circuit 51, while the variable capacitance switch 55 is a switch for connecting or disconnecting the antenna 53 and the transmission circuit 52. Note that the impedance matching circuit and the like are omitted in the drawing.

The variable capacitance device 11, 11B, 11C or 11D described above is used as the variable capacitance switches 54 and 55, and the control voltage VC is set to a value that is sufficiently large. Thus, the capacitance CP is changed largely, so that electric impedance is changed largely. Since the radio frequency used in the mobile terminal is in gigahertz band or close to the same, operation realized by changing the capacitance CP is equivalent to the electric switch.

In FIG. 14, the variable capacitance switch 54 for the reception circuit is turned off, while the variable capacitance switch 55 for the transmission circuit is turned on. Therefore, the antenna 53 is connected to the transmission circuit 52.

In this state, as shown in FIG. 15A, the control voltage VC is not applied to the variable capacitance switch 54. The upper electrode 25 is separated from the dielectric film 26, and the capacitance CP is small. In addition, as shown in FIG. 15B, the maximum voltage VS as the control voltage VC is applied to the variable capacitance switch 55, and the upper electrode 25 is contacting the dielectric film 26 in this state. Therefore, the capacitance CP is very large. In addition, by changing the state of the control voltage VC to the opposite state, the variable capacitance switch 54 is turned on while the variable capacitance switch 55 is turned off.

As shown in FIG. 16, transmission and reception are switched alternately in synchronization with the switching timing, polarity of the control voltage VC with respect to the variable capacitance switches 54 and 55 is switched.

More specifically, the control voltage VC of the variable capacitance switch 54 for the reception circuit becomes the predetermined voltage VS in the reception, while it becomes 0 volt in the transmission. The polarity of the control voltage VC is switched every time when it becomes the reception section.

In addition, the control voltage VC of the variable capacitance switch 55 for the transmission circuit becomes the predetermined voltage VS in the transmission, while it becomes 0 volt in the reception. The polarity of the control voltage VC is switched every time when it becomes the transmission section.

In this way, the charge up of the dielectric film 26 can be prevented so that the switching operation can be performed securely also in the case where the variable capacitance device 11, 11B, 11C or 11D is used as the variable capacitance switches 54 and 55 by switching the polarity of the control voltage VC at an appropriate period.

According to the embodiment described above, it is possible to provide a variable capacitance element, a variable capacitance switch, an impedance matching circuit or a transmission and reception switching circuit that enables more accurate control than the conventional one by suppressing occurrence of hysteresis.

In the embodiment described above, the structure, the shape, the material, the numbers and the like of the variable capacitance device 11, 11B, 11C can be modified variously. Furthermore, the structure, the shape, the size, the number, the material of a whole or a part of the variable capacitance device, the impedance matching circuit 40, the variable capacitance switches 54 and 55, the driving circuit 12 and the micro machine system 3, the circuit structure, the waveform of the control voltage VC, the switching timing of the polarity, the period or the frequency, and the like can be modified if necessary in accordance with the spirit of the present invention.

Although the above description exemplifies the variable capacitance device as the micro machine device, the same effect can be expected by changing the polarity of the control voltage VC at regular intervals also with respect to other micro machine device in which charge up may occur by the control voltage VC.

Although the embodiment of the present invention is described above with reference to several examples, the present invention can be embodied variously as recited in the claims without limiting to the embodiment described above.

What is claimed is:

1. A drive control method for a micro machine device made up of first and second electrodes opposed to each other and a dielectric layer disposed therebetween, the drive control method comprising:
   applying a control voltage between the first and the second electrodes so that an electrostatic force is exerted on the first and the second electrodes to displace the first or the second electrode; and
   switching polarity of the control voltage at a predetermined period or shorter,
   wherein the micro machine device is a variable capacitance element that can change its capacitance by displacement of the first or the second electrode, and
   the predetermined period to switch the polarity of the control voltage is a short period of time in which polarization due to space charge transfer does not occur in the dielectric layer.

2. A drive control method for a micro machine device made up of first and second electrodes opposed to each other and a dielectric layer disposed therebetween, the drive control method comprising:
   applying a control voltage between the first and the second electrodes so that an electrostatic force is exerted on the first and the second electrodes to displace the first or the second electrode; and
   switching polarity of the control voltage at a predetermined period or shorter,
   wherein the micro machine device is a variable capacitance element that can change its capacitance by displacement of the first or the second electrode, and
   the predetermined period to switch the polarity of the control voltage is a short period of time in which variation of the capacitance between the first and the second electrodes from an initial value becomes 10% or smaller after starting the application of the control voltage.

3. A drive control method for a micro machine device made up of first and second electrodes opposed to each other and a dielectric layer disposed therebetween, the drive control method comprising:
   applying a control voltage between the first and the second electrodes so that an electrostatic force is exerted on the first and the second electrodes to displace the first or the second electrode; and
   switching polarity of the control voltage at a predetermined period or shorter,
   wherein the micro machine device is a variable capacitance element that can change its capacitance by displacement of the first or the second electrode, and
   the polarity of the control voltage is switched in an idle period of a circuit to which the variable capacitance element is connected.

4. A drive control unit for a micro machine device made up of first and second electrodes opposed to each other and a dielectric layer disposed therebetween, the drive control unit is provided with a control voltage applying portion to apply a control voltage between the first and the second electrodes so that an electrostatic force is exerted on the first and the second electrodes to displace the first or the second electrode, wherein
   the control voltage applying portion applies to the first and the second electrodes the control voltage whose polarity switches at a predetermined period or shorter,
   the micro machine device is a variable capacitance element that can change its capacitance by displacement of the first or the second electrode, and
   the predetermined period to switch the polarity of the control voltage is a short period of time in which polarization due to space charge transfer does not occur in the dielectric layer.

5. A drive control unit for a micro machine device made up of first and second electrodes opposed to each other and a dielectric layer disposed therebetween, the drive control unit is provided with a control voltage applying portion to apply a control voltage between the first and the second electrodes so that an electrostatic force is exerted on the first and the second electrodes to displace the first or the second electrode, wherein
   the control voltage applying portion applies to the first and the second electrodes the control voltage whose polarity switches at a predetermined period or shorter,
   the micro machine device is a variable capacitance element that can change its capacitance by displacement of the first or the second electrode, and
   the predetermined period to switch the polarity of the control voltage is a short period of time in which variation of the capacitance between the first and the second electrodes from an initial value becomes 10% or smaller after starting the application of the control voltage.

6. A drive control unit for a micro machine device made up of first and second electrodes opposed to each other and a dielectric layer disposed therebetween, the drive control unit is provided with a control voltage applying portion to apply a control voltage between the first and the second electrodes so that an electrostatic force is exerted on the first and the second electrodes to displace the first or the second electrode, wherein
   the control voltage applying portion applies to the first and the second electrodes the control voltage whose polarity switches at a predetermined period or shorter,
   the micro machine device is a variable capacitance element that can change its capacitance by displacement of the first or the second electrode, and
   the polarity of the control voltage is switched in an idle period of a circuit to which the variable capacitance element is connected.

7. A variable capacitance switch made up of a micro machine device comprising first and second electrodes opposed to each other and a dielectric layer disposed between them, the first or the second electrode being displaced so as to switch on and off of a circuit when a control voltage is applied between the first and the second electrodes, wherein
   material and thickness of the dielectric layer are selected and formed so that a variation of capacitance between the first and the second electrodes from an initial value becomes 10% or smaller when polarity of the control voltage is switched at a period of 5 milliseconds.

8. The variable capacitance switch according to claim 7, further comprising:
   an insulator film that is displaced together with the displacement of the first or the second electrode;
   a third electrode provided to the insulator film;
   a fourth electrode opposed to the third electrode; and
   a second dielectric layer formed between the third and the fourth electrodes, wherein
   a space between the third and the fourth electrodes is changed as the insulator film is displaced, which causes change of impedance so that on and off of the circuit is switched.

9. An impedance matching circuit including a variable capacitance element provided to a communication circuit, wherein the variable capacitance element is a micro machine device of variable capacitance having first and second electrodes opposed to each other and a dielectric layer disposed between them, a control voltage is applied between the first and the second electrodes so that an electrostatic force is exerted on the first and the second electrodes for displacing the first or the second electrode and thus matching impedance, and polarity of the control voltage is switched during an idle period of the communication circuit.

10. The impedance matching circuit according to claim 9, wherein the period for switching the polarity of the control voltage is a short period of time in which polarization due to space charge transfer does not occur in the dielectric layer.

11. The impedance matching circuit according to claim 9, wherein the period for switching the polarity of the control voltage is 100 milliseconds or shorter.

12. The impedance matching circuit according to claim 9, wherein the micro machine device is a variable capacitance element that can change its capacitance by displacement of the first or the second electrode, and the period for switching the polarity of the control voltage is a short period of time in which variation of capacitance between the first and the second electrodes from an initial value becomes 10% or smaller after starting the application of the control voltage.

13. The impedance matching circuit according to claim 9, wherein the micro machine device is a variable capacitance element that can change its capacitance by displacement of the first or the second electrode, and the polarity of the control voltage is switched in an idle period of a circuit to which the variable capacitance element is connected.

14. A transmission and reception switching circuit for switching between transmission operation by a transmission circuit and reception operation by a reception circuit, comprising:

a first variable capacitance switch made up of a micro machine device that enables the transmission circuit to perform the transmission operation when it is turned on; and a second variable capacitance switch made up of a micro machine device that enables the reception circuit to perform the reception operation when it is turned on, wherein each of the first and the second variable capacitance switches includes first and second electrodes opposed to each other and a dielectric layer disposed between them, the first or the second electrode being displaced so as to switch on and off of a circuit when a control voltage is applied between the first and the second electrodes, and polarity of the control voltage to be applied is switched at the timing of switching each of the first and the second variable capacitance switches from off to on.

15. The transmission and reception switching circuit according to claim 14, wherein the first and the second variable capacitance switches are turned on alternately so that the transmission operation by the transmission circuit and the reception operation by the reception circuit are switched alternately at regular intervals.

16. The transmission and reception switching circuit according to claim 14, wherein the period for switching the polarity of the control voltage is a short period of time in which polarization due to space charge transfer does not occur in the dielectric layer.

17. The transmission and reception switching circuit according to claim 14, wherein the period for switching the polarity of the control voltage is 100 milliseconds or shorter.

18. The transmission and reception switching circuit according to claim 14, wherein the micro machine device is a variable capacitance element that can change its capacitance by displacement of the first or the second electrode, and the period for switching the polarity of the control voltage is a short period of time in which variation of capacitance between the first and the second electrodes from an initial value becomes 10% or smaller after starting the application of the control voltage.

19. The transmission and reception switching circuit according to claim 14, wherein the micro machine device is a variable capacitance element that can change its capacitance by displacement of the first or the second electrode, and the polarity of the control voltage is switched in an idle period of a circuit to which the variable capacitance element is connected.

* * * * *